(12) United States Patent
Mimoto et al.

(10) Patent No.: US 6,326,693 B1
(45) Date of Patent: Dec. 4, 2001

(54) SEMICONDUCTOR INTEGRATED CIRCUIT DEVICE

(75) Inventors: Kenichiro Mimoto; Takehiko Hojo, both of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/372,992

(22) Filed: Aug. 12, 1999

(30) Foreign Application Priority Data

Aug. 17, 1998 (JP) .................................................. 10-230731

(51) Int. Cl.⁷ ........................... H01L 23/48; H01L 23/52; H01L 29/40
(52) U.S. Cl. ........................ 257/773; 257/776; 257/210; 257/208; 257/691
(58) Field of Search .................................... 257/773, 776, 257/211, 210, 208, 691

(56) References Cited

U.S. PATENT DOCUMENTS

| | | |
|---|---|---|
| 4,575,744 * | 3/1986 | Caldwell et al. . |
| 4,746,966 * | 5/1988 | Fitzgerald . |
| 4,914,503 * | 4/1990 | Shirato et al. . |
| 5,119,168 * | 6/1992 | Misawa . |
| 5,119,169 * | 6/1992 | Konzono et al. . |
| 5,401,989 * | 3/1995 | Kikuchi . |
| 5,442,206 * | 8/1995 | Ienaga et al. . |
| 6,025,616 * | 2/2000 | Nguyen et al. . |
| 6,078,068 * | 6/2000 | Tamura . |

FOREIGN PATENT DOCUMENTS 7-29977  1/1995  (JP) .

* cited by examiner

Primary Examiner—Sheila V. Clark
(74) Attorney, Agent, or Firm—Oblon, Spivak, McClelland, Maier & Neustadt, P.C.

(57) ABSTRACT

A semiconductor integrated circuit device has core circuits having rectangular shapes in plan view and power lines surronding the core circuit to connect the cores with an external power supply. The power lines are constructed in a plurality of interconnection layers and include interlayer connections so that they have overlapping parts. Interconnections between core circuits are commonly used so as to decrease interconnection area.

11 Claims, 12 Drawing Sheets

SEMICONDUCTOR INTEGRATED CIRCUIT DEVICE

BACKGROUND OF THE INVENTION

1. Field of the Invention

This invention relates to a semiconductor integrated circuit device, and more particularly to a semiconductor integrated circuit device having a standard cell or an embedded array.

2. Related Art

Semiconductor devices have been widely used in various fields of household electric appliances and developments of semiconductor integrated circuits for specific appliances have been strongly demanded. For this purpose, in recent years, an ASIC (Application Specific Integrated Circuit) technology has intensively been developed.

In the ASIC technology, two types of technology are employed, one is a standard cell system and the other is an embedded array system. The standard cell system has features of a high degree of integration and flexibility in design, and the embedded array system has a feature of a short development term in addition to the features of the standard cell system.

In either of the systems, in order to obtain higher integration, it is necessary to decrease area of interconnections while maintaining the flexibility in design.

There have been used two major methods for connecting a power terminal and a ground terminal to a semiconductor integrated circuit having a plurality of cores of ROMs and/or RAMs, etc.

These conventional connection methods will be explained in the following description with reference to FIGS. 1–5. It is to be noted that hereinafter the same parts will be indicated by the same reference numerals and their repeating explanations will be omitted.

The first method is a direct connection of the power and ground terminals to I/O cells of a core. FIG. 1 is a plan view showing this method. As shown in FIG. 1, power terminals 101a, 101b, 102a and 102b connected to an I/O cell in a core 1 are provided at peripheral sides of the core 1, and $V_{DD}$ and $V_{SS}$ are supplied to the power terminals. In this method, however, flexibility in design will be remarkably decreased since locations of the power terminals are fixed.

The second method is to dispose two interconnecting conductors in the peripheral part of the core to surround the core, with each of the conductors being connected to $V_{DD}$ and $V_{SS}$. FIG. 2 is a plan view for explanation of this method. Such configuration of the interconnections will be referred to "ring-shaped" hereinafter. Referring to FIG. 2, there are provided a first surrounding interconnection 111 around the core 1 and a second surrounding interconnection 112 around the first surrounding interconnection 111. $V_{DD}$ and $V_{SS}$ are supplied to these interconnections 111 and 112, respectively. The interconnections 111 and 112 are formed in the same layer, and for example, the interconnection 111 is connected to the core 1 via a coupling conductor (not shown in FIG. 2) formed in the same layer and lower layer and the interconnection 112 is connected to the core 1 via a coupling conductor formed in upper layer or lower layer. Thus by using ring-shaped interconnections, connections of power supply $V_{DD}$ and $V_{SS}$ to interconnections can be performed at any side, which results in improved flexibility in design.

This second method indeed improves flexibility in design when compared to the first method shown in FIG. 1, however, the second method requires additional area for arranging interconnections 111 and 112 which decreases the degree of integration. Since in the ASIC technology, a chip generally includes a plurality of cores, which require additional area for connections with power supplies of the plurality of cores, and therefore the integration of the whole device is remarkably decreased.

FIG. 3 shows a plan view of the semiconductor integrated circuit device 120 having two cores, to which the method shown in FIG. 2 is applied. As shown in FIG. 3, two cores 1 and 2 are respectively provided with interconnections 111 surrounding each core and the interconnections 112 surrounding the interconnections 111, respectively. This arrangement needs an area for 4 interconnections between the core 1 and the core 2, which results in decrease in integration of the semiconductor device.

Furthermore, as shown in FIG. 4, in the case where a semiconductor integrated circuit device 140 has three or more cores (cores 1, 2 and 3) arranged in matrix form, areas for interconnections are necessary between neighboring cores in both x-direction and y-direction, which will remarkably decrease the integration of the device.

SUMMARY OF THE INVENTION

An object of the present invention is to provide a semiconductor integrated circuit having interconnections for supplying power in small area without deteriorating flexibility in design.

According to the first aspect of the invention, there is provided; a semiconductor integrated circuit device comprising; a core circuit having a plan rectangular shape, a first interconnection disposed around the core circuit and adapted to connect the core circuit to a first external terminal, and,
  a second interconnection disposed around said first interconnection and adapted to connect the core circuit to a second external terminal, wherein said first interconnection and said second interconnection have overlapping parts formed through different layers.

It is preferable that said first interconnection has a plurality of layers for interconnection and said second interconnection has a plurality of layers.

X-direction portions of the first and the second interconnections are preferably formed in a first layer for interconnection, and, y-direction portions of the first and the second interconnections are preferably formed in a second layer for interconnection, both interconnections being in different levels.

According to the second aspect of the present invention there is provided;
  a semiconductor integrated circuit device comprising; a plurality of core circuits each having a plan rectangular shape, a first interconnection disposed around the core circuit and adapted to connect the core circuit to a first external terminal, and, a second interconnection disposed around said first interconnection and adapted to connect the core circuit to a second external terminal, wherein said first interconnection and said second interconnection have overlapping parts formed through different layers, and said first interconnection and said second interconnection use at least one side line between two adjacent core circuits commonly.

According to the third aspect of the present invention there is provided a semiconductor integrated circuit device comprising a core circuit having a plan rectangular shape, a first interconnection disposed around the core circuit and adapted to connect the core circuit to a first external terminal, a second interconnection disposed around said first interconnection and adapted to connect the core circuit to a second external terminal, and a logic circuit adjacent to said core circuit, wherein said first interconnection and said second interconnection have overlapping parts formed through different layers and parts of these interconnections located between the core circuit and the logic circuit being commonly used by the logic circuit and the core circuit.

BRIEF DESCRIPTION OF THE DRAWINGS

In the attached drawings.

DESCRIPTION OF THE PREFERRED EMBODIMENTS

Preferred embodiments of the invention will be explained in the following description with reference to the attached drawings.

The first embodiment according to the present invention will be described referring to FIG. 5. This embodiment is an application for connecting interconnections to a single core, which is a basic form for other embodiments mentioned later.

Figure 5:
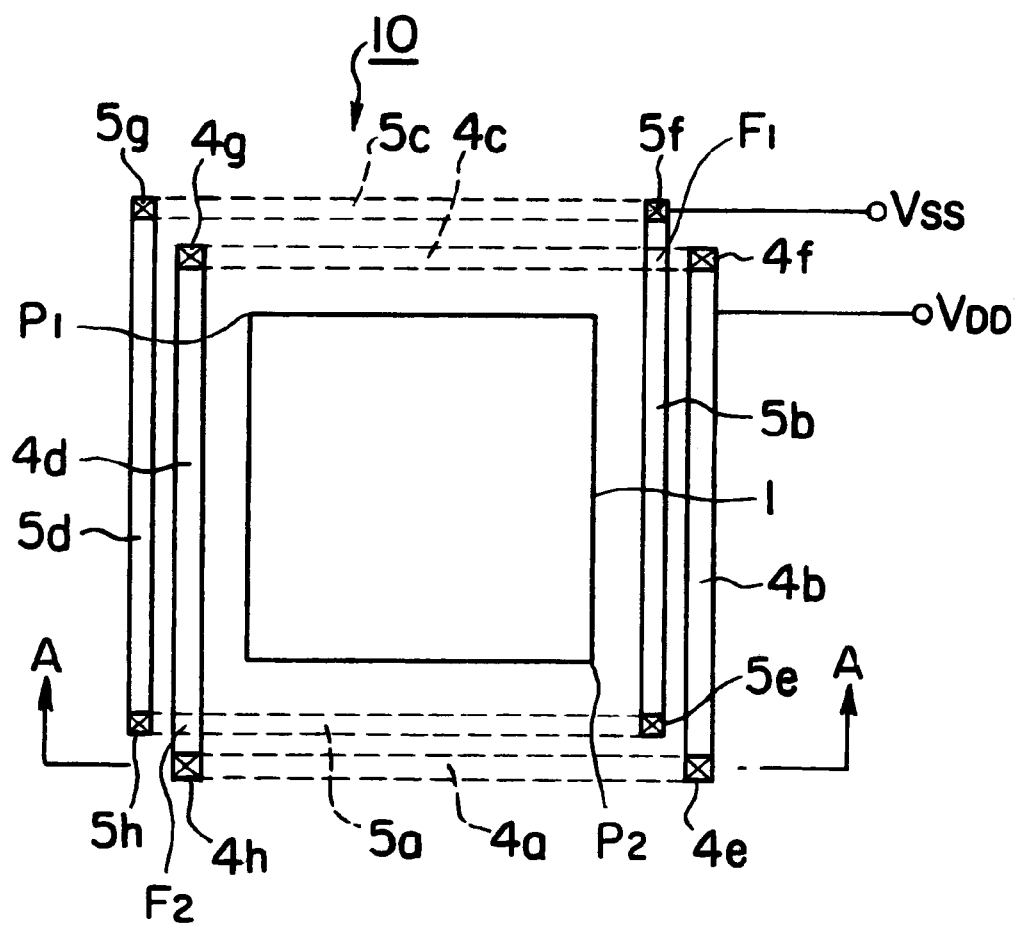
FIG. 5 is a plan view showing a main part of the first embodiment of a semiconductor integrated circuit according to the invention.

FIG. 5 is a plan view showing a main part of the semiconductor integrated circuit 10 according to the first embodiment. In FIG. 5, a core 1 has a rectangular plan shape, and two power lines 4 and 5 surround the core 1. Power lines 4 and 5 have respectively rectangular plan shapes similar to that of the core 1. The power line 5 is formed in a manner that the power line 4 is moved in an imaginary diagonal line passing opposing corner (for example, P1 and P2) of the rectangle of the core 1. Both the power lines 4 and 5 run through a plurality of interconnection layers of a semiconductor substrate, and end points of sides of the power lines are connected through interlayer interconnections. More specifically, in this embodiment, x-direction side lines 4a, 5a, 4c and 5c are formed in the first layer and y-direction side lines 4b, 5b, 4d and 5d are formed in the second layer which is, e.g., an upper layer of the first layer. Accordingly, a crossing part F1 in plan view forms an overlapping part where the side line 5b of the power lines 5 in the second layer overlaps the side line 4c of the power lines 4 in the first layer. Similarly another crossing part F2 in plan view of the FIG. 6 forms an overlapping part where the side line 4d of the power line 4 in the second layer overlaps the side line 5a of the power line 5 in the first layer. At positions indicated by reference numerals 4e–4h and be –5h, interlayer interconnections for connecting side lines of different layers are provided.

Figure 6:
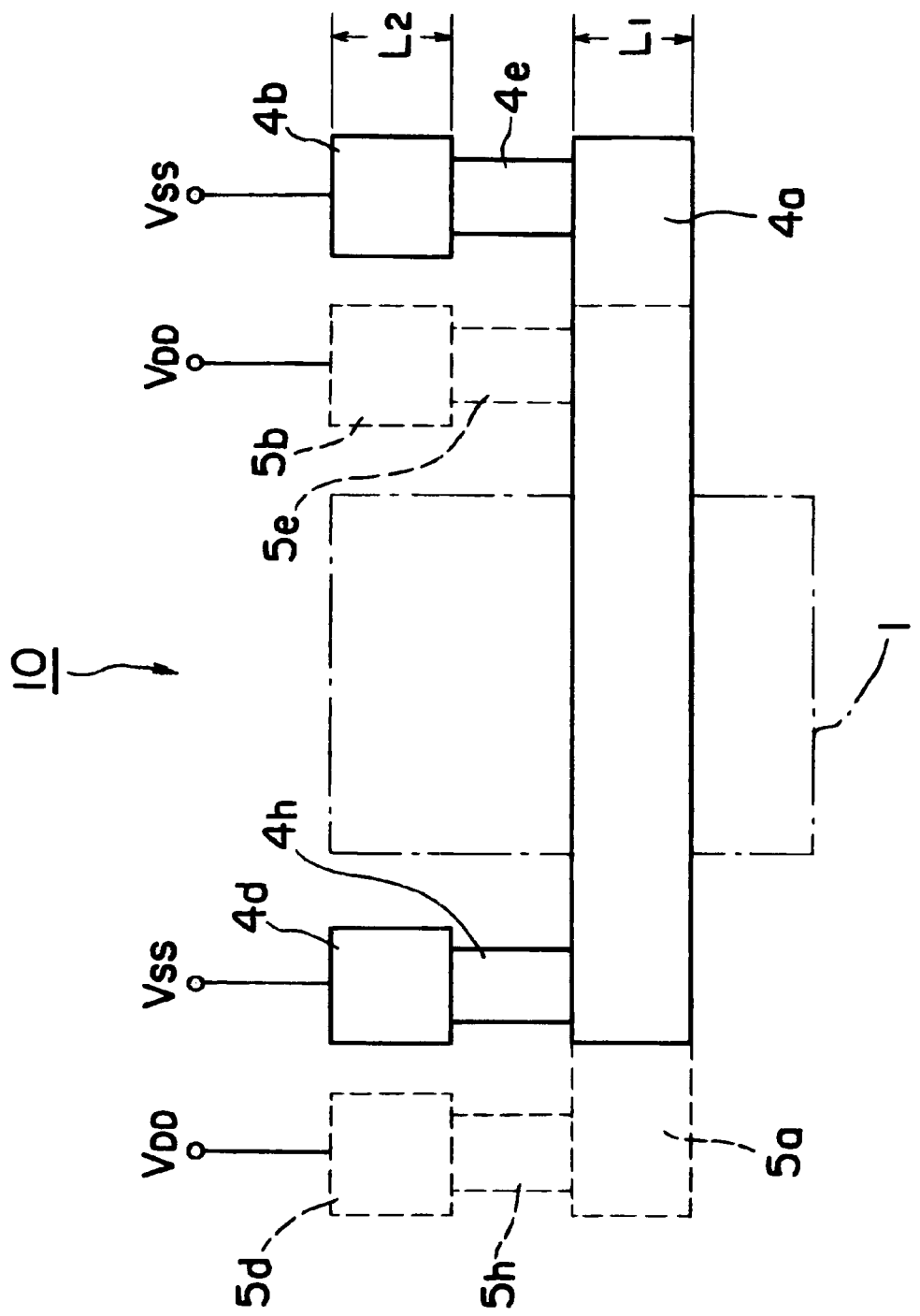
FIG. 6 is a sectional view showing the semiconductor integrated circuit shown in FIG. 6.

FIG. 6 is a sectional view along the A—A line showing the semiconductor integrated circuit shown in FIG. 5. In FIG. 6, parts expressed by solid lines show the shape of the power line 4 and parts expressed by dotted lines show the shape of the power line 5.

As shown in FIG. 6, the core circuit 1 is disposed in the part drawn by dashed line and in front of the core 1 a side line 4a is formed in the layer L1. Sections of the side lines 4b and 4d are shown in the interconnection layer L2 above the right and left ends of the interconnection 4a. These side lines extend to the direction backward and perpendicular to the paper. At the ends of the side line 4a, interlayer interconnections 4e and 4h are formed to be respectively connected to the side lines 4b and 4d in the interconnection layer L2.

In the left part of the side line 4a, a part of the side line 5a of the line 5 drawn by dotted line is shown. The side line 5a is connected to the side lines 5b and 5d formed in the layer L2 via the interlayer interconnection 5e, 5h in the same manner as the case of the line 4.

In this embodiment, as shown in FIG. 6, the x-direction side lines of the power lines 4 and 5 are formed in layer L1, and the y-direction side lines of the power lines 4 and 5 are formed in layer L2. However, the y-direction side lines may be formed in the layer L1 and the x-direction side lines may be formed in interconnection layer L2. Furthermore, power lines 4 and 5 are formed using two layers, but these lines are formed using any lines of multi-layer interconnections having three or more layers. For example, in a semiconductor device having three interconnection layers, the x-direction side lines of the power lines 4 and 5 may be formed in the first layer and y-direction side lines of the power lines may be formed in the third interconnection layer.

Furthermore, in this embodiment, though there has been explained the semiconductor device having two power lines of the same shape, this invention should not be limited to such embodiment. The present invention can be embodied in various configurations as long as the two interconnections have no crossing in the same layer but have an overlapping part where an upper interconnection overlaps a lower interconnection through a interlayer insulation film. Other embodiments including configurations different from the power lines 4 and 5 shown in FIG. 5 will be explained in the following second to fourth embodiments according to the invention.

Figure 7:
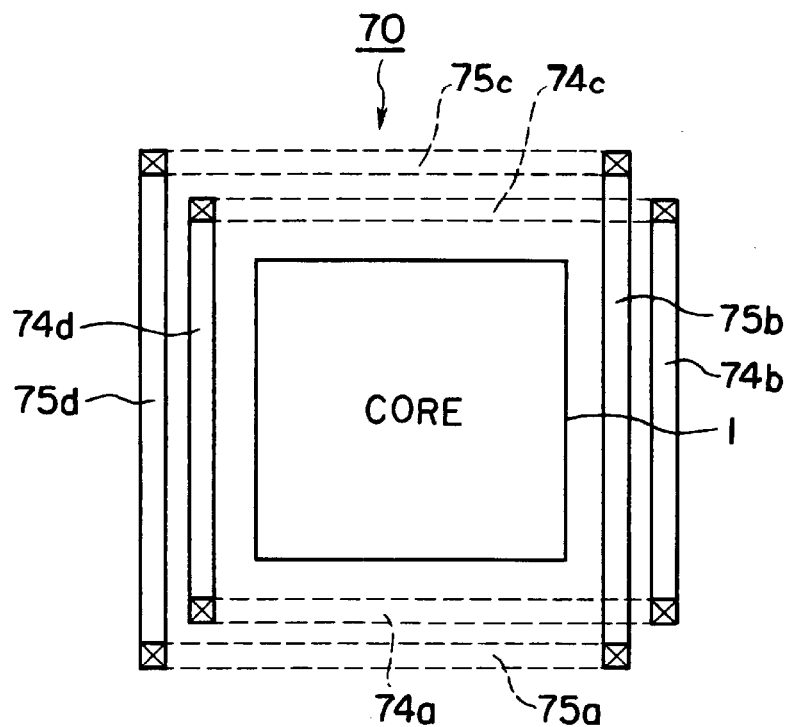
FIG. 7 is a plan view showing a main part of the second embodiment of a semiconductor integrated circuit according to the invention.

FIG. 7 is a plan view showing a main part of the second embodiment of a semiconductor integrated circuit according to the present invention. FIG. 7 shows the semiconductor integrated circuit 70 having the core circuit 1 and the power lines 74 and 75 for supplying power to the core circuit 1. This embodiment shown in FIG. 7 is also the second basic arrangement for the fifth to eighth embodiments which will be mentioned later.

In this embodiment, as shown in FIG. 7, power lines 74 and 75 are respectively formed in oblong shape and arranged so that the long side lines thereof are orthogonal to each other. The long side line 74a of the power line 74 is disposed between the core circuit 1 and a short side line 75a of the power line 75, and the long side line 74c of the power line 74 is also disposed between the core 1 and the long side line 75c of the power line 75. The short side line 74d of the power line 74 is disposed between the core circuit 1 and a long side line 75d of the power line 75. The another short line 74b of the power line 74 is disposed outside of the other long side line 75b of the power line 75 from the core circuit 1. As for layer levels of side lines, side lines 74a, 75a, 74c and 75c are formed in the first layer and side lines 74b, 75b, 74d and 75d are formed in the second layer and both ends of the side lines are interconnected to the corresponding ends in different layer via the interlayer interconnections in the same manner as the power lines 4 and 5 shown in FIG. 5.

According to this embodiment, though the core circuit 1 can not be connected in the same layer with the side lines 75a and 75c from the front side or the backside, it can be connected in the same layer with the side lines 75b and 74d from the right and the left sides, which results in the improved flexibility in design comparing with the prior art.

In the first and the second embodiments described above, side lines of the two adjacent power lines disposed in parallel are formed in the same layer. However, the present invention is not limited to such a configuration. That is, the two adjacent power lines disposed in parallel can be formed in different layers. Such case will be described as follows referring to FIG. 8 as the third embodiment of the semiconductor integrated circuit device according to the invention.

Figure 8:
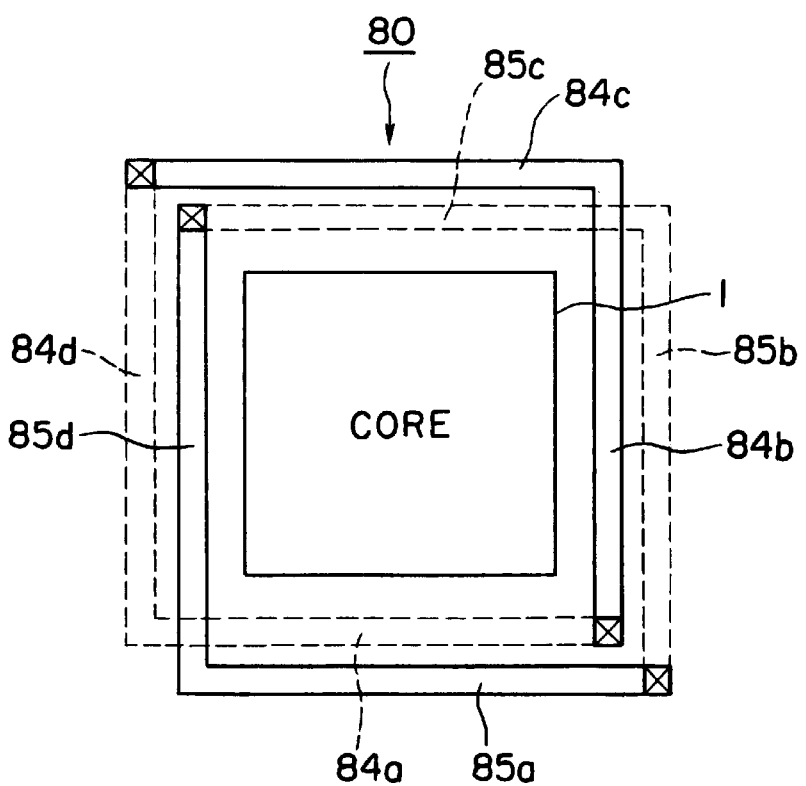
FIG. 8 is a plan view showing a main part of the third embodiment of a semiconductor integrated circuit according to the invention.

FIG. 8 is the semiconductor integrated circuit device 80 having the core circuit 1 and power lines 84 and 85, whose arrangement is the third basic configuration for the fifth to eighth embodiments mentioned later.

As apparent from the comparison with FIG. 5, configurations of the power lines 84 and 85 are similar to those of the semiconductor device 10 shown in FIG. 5, but this embodiment is characterized in that the layer levels of each side lines are different from that of the semiconductor device 10. More specifically, side lines 84a, 84d, 85b and 85c of power lines 84 and 85 are formed in the first layer and the side lines 84b, 84c, 85a and 85d are formed in the second layer and any side line adjacent and therefore side lines disposed in parallel are formed in different layers.

Such arrangement enables the core circuit 1 to be directly connected with power lines 84 and 85 in the corresponding layer from the all side lines of the front, back, right and left. Thus with this embodiment, a semiconductor integrated circuit device having high flexibility in design is provided.

In the first to the third embodiments described above, each power line is constructed by two different layers. However, the present invention is not limited to such a configuration.

That is, each power line may be constructed in a single layer provided that the two power lines are constructed as different layers having levels so that they have overlapping parts. Such case will be described as follows referring to FIG. 9 as the fourth embodiment of the semiconductor integrated circuit device according to the invention.

Figure 9:
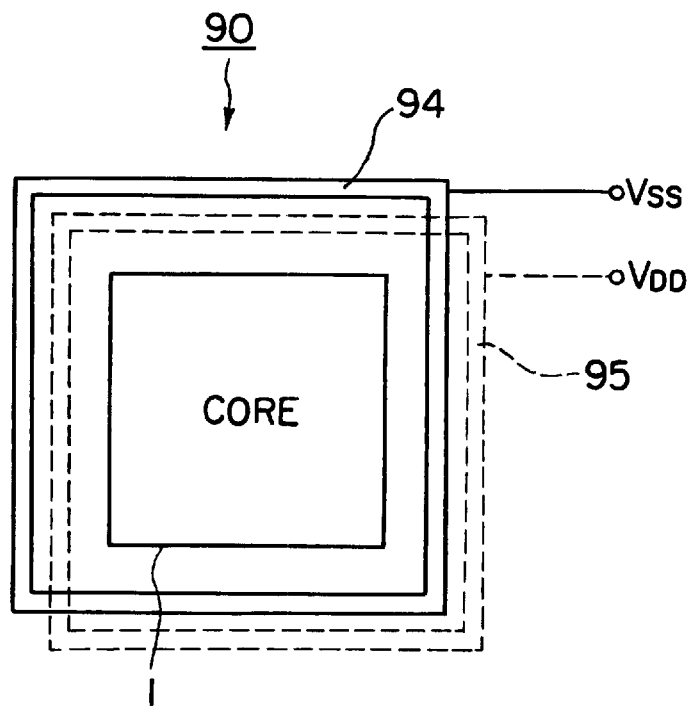
FIG. 9 is a plan view showing a main part of the fourth embodiment of a semiconductor integrated circuit according to the invention.

FIG. 9 is the semiconductor integrated circuit device 90 having the core circuit 1 and power lines 94 and 95, whose arrangement is the fourth basic configuration for the fifth to eighth embodiments mentioned later.

As apparent from the comparison with FIG. 5, configurations of the power lines 94 and 95 are similar to those of the semiconductor device 10 shown in FIG. 5, but this embodiment is featured that the layer levels of the two power lines are different from each other. It is to be noted that all side lines of each power line are formed in the same layer. More specifically, the power line 95 is connected to $V_{DD}$ and all side lines thereof are formed in the first layer, and the power line 94 is connected to $V_{SS}$ and all side lines thereof are formed in the second layer.

Such arrangement enables the core circuit 1 to be directly connected with power line 95 in the first layer and power line 94 in the second layer from all side lines of the front, back, right and left. Thus with this embodiment, a semiconductor integrated circuit device having higher flexibility in design is provided.

The fifth embodiment of the semiconductor integrated circuit device according to the invention will be explained hereafter with reference to drawings. This embodiment is an application of the first embodiment for a semiconductor device having two core circuits.

Figure 10:
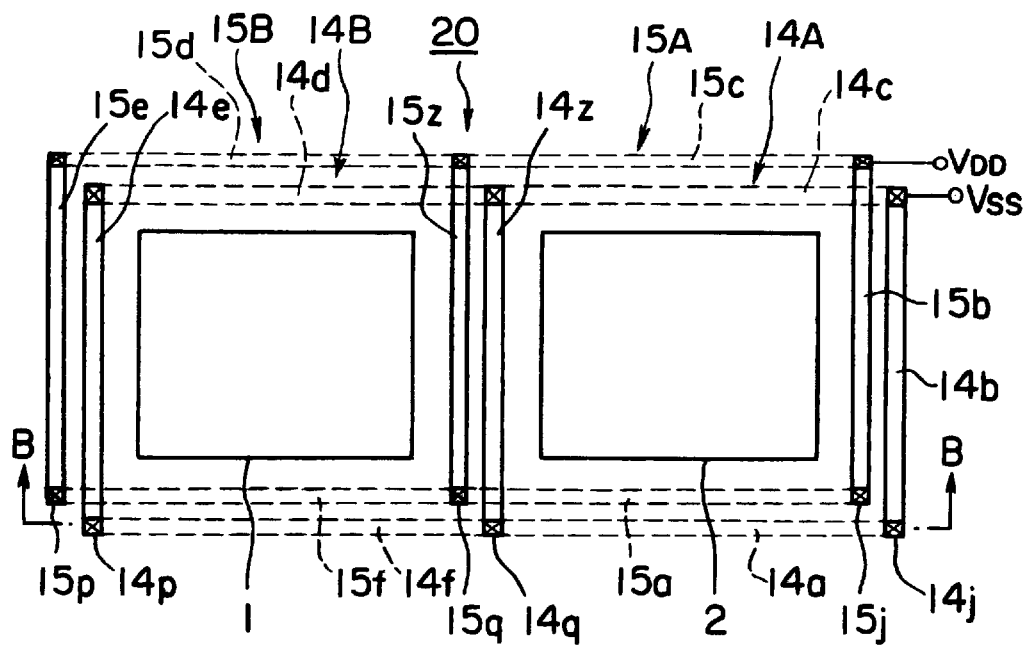
FIG. 10 is a plan view showing a main part of the fifth embodiment of a semiconductor integrated circuit according to the invention.

FIG. 10 is a plan view showing a main part of the fifth embodiment of the semiconductor integrated circuit device 20 according to the present invention. As shown in FIG. 10, the semiconductor device 20 has two core circuits 1 and 2. Core circuits 1 and 2 have similar rectangular plan shapes and similar occupying areas, and disposed so that corresponding side lines in x-direction are on the same line.

Around the core circuits 1 and 2, there are provided power lines 14A and 14B having the same shape as the line 4 shown in FIG. 5 and power lines 15A and 15B having the same shape as the line 5 shown in FIG. 5. The power lines 14A and 14B share one common side line 14z and the power lines 15A and 15B share one common side line 15z between the core circuit 1 and 2. The power line 14A is composed of side lines 14a, 14b, 14c and 14z and 14B is composed of side lines 14d, 14e, 14f and 14z. Similarly, the power line 15A is composed of side lines 15a, 15b, 15c and 15z and 15B is composed of sidelines 15d, 15e, 15f and 15z. Therefore, interconnections 14 and 15 respectively compose ladder type interconnection patterns including cores in the every lattice.

These interconnections 14A and 14B are shifted interconnections 15A and 15B along a diagonal line passing the corners of the cores 1 and 2. In this embodiment, the power lines 14A and 14B are connected to the ground terminal $V_{SS}$ and the power lines 15A and 15B are connected to the power terminal $V_{DD}$.

Figure 1:
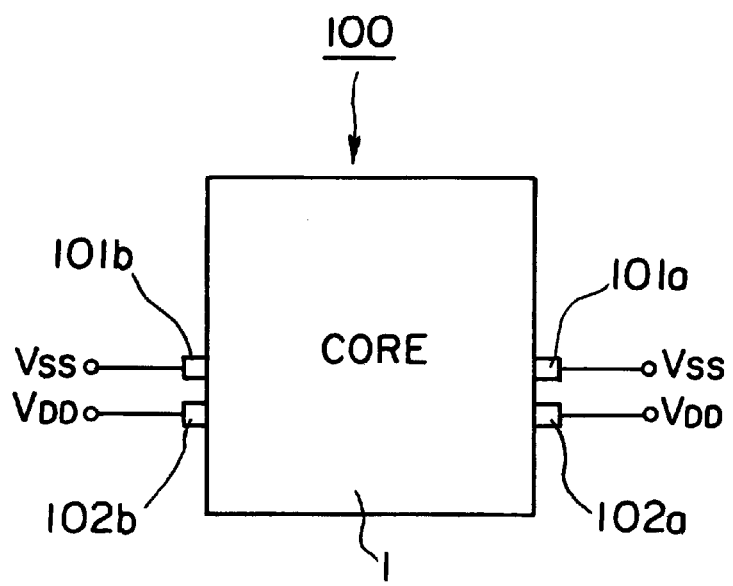
FIG. 1 is a plan view showing a method for interconnection according to a prior art.
Figure 2:
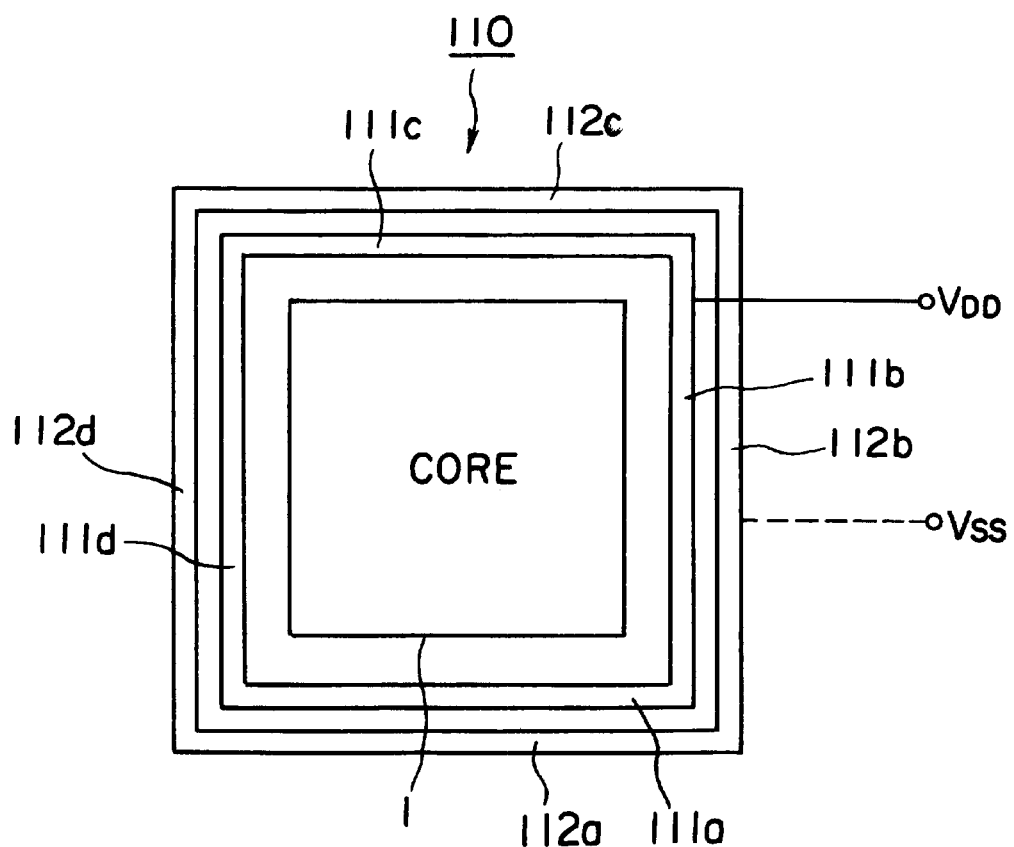
FIG. 2 is a plan view showing another method for interconnection according to a prior art.
Figure 3:
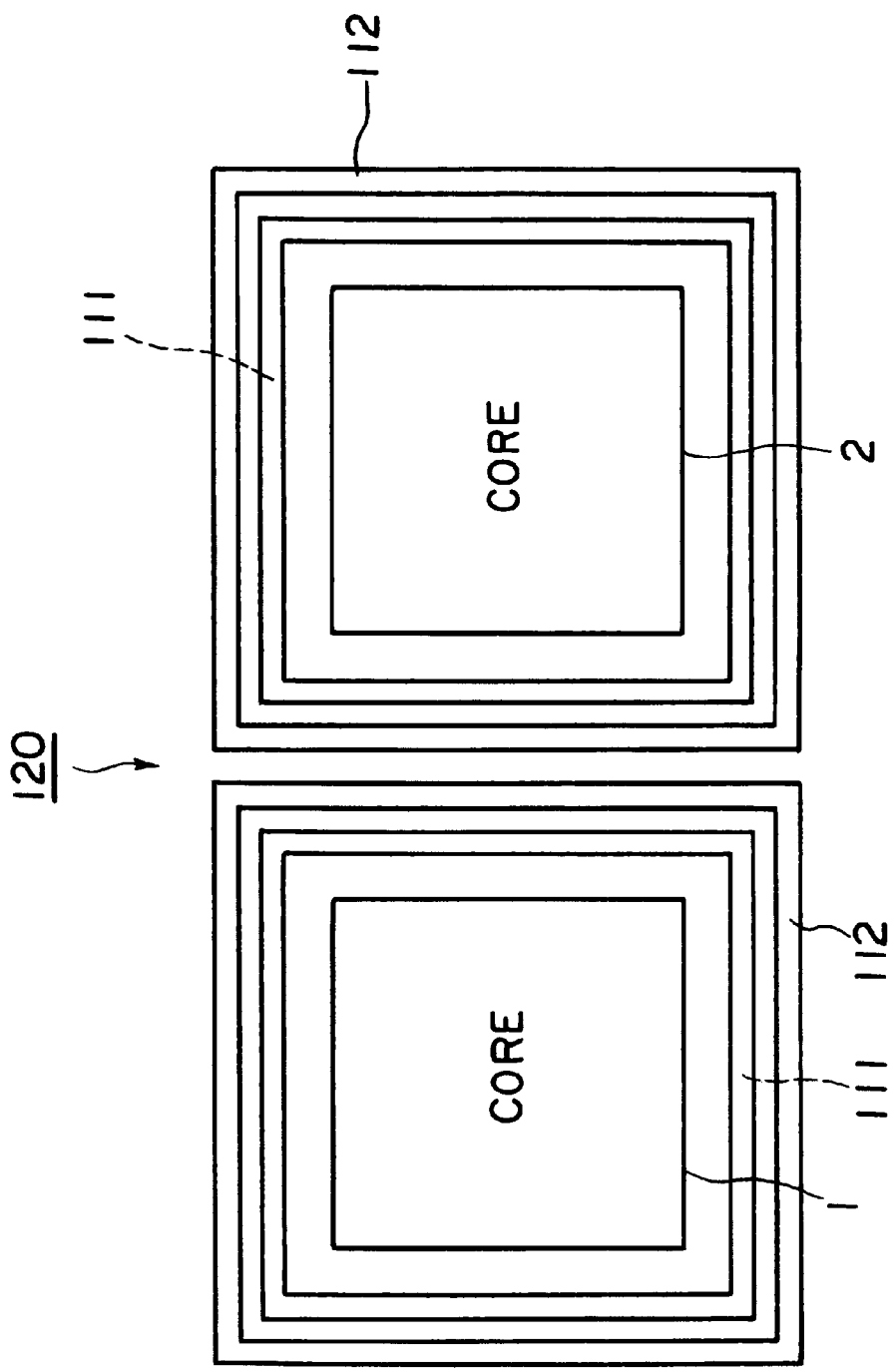
FIG. 3 shows an example of a semiconductor integrated circuit device having a plurality of cores, to which the method shown in FIG. 2 is applied.
Figure 4:
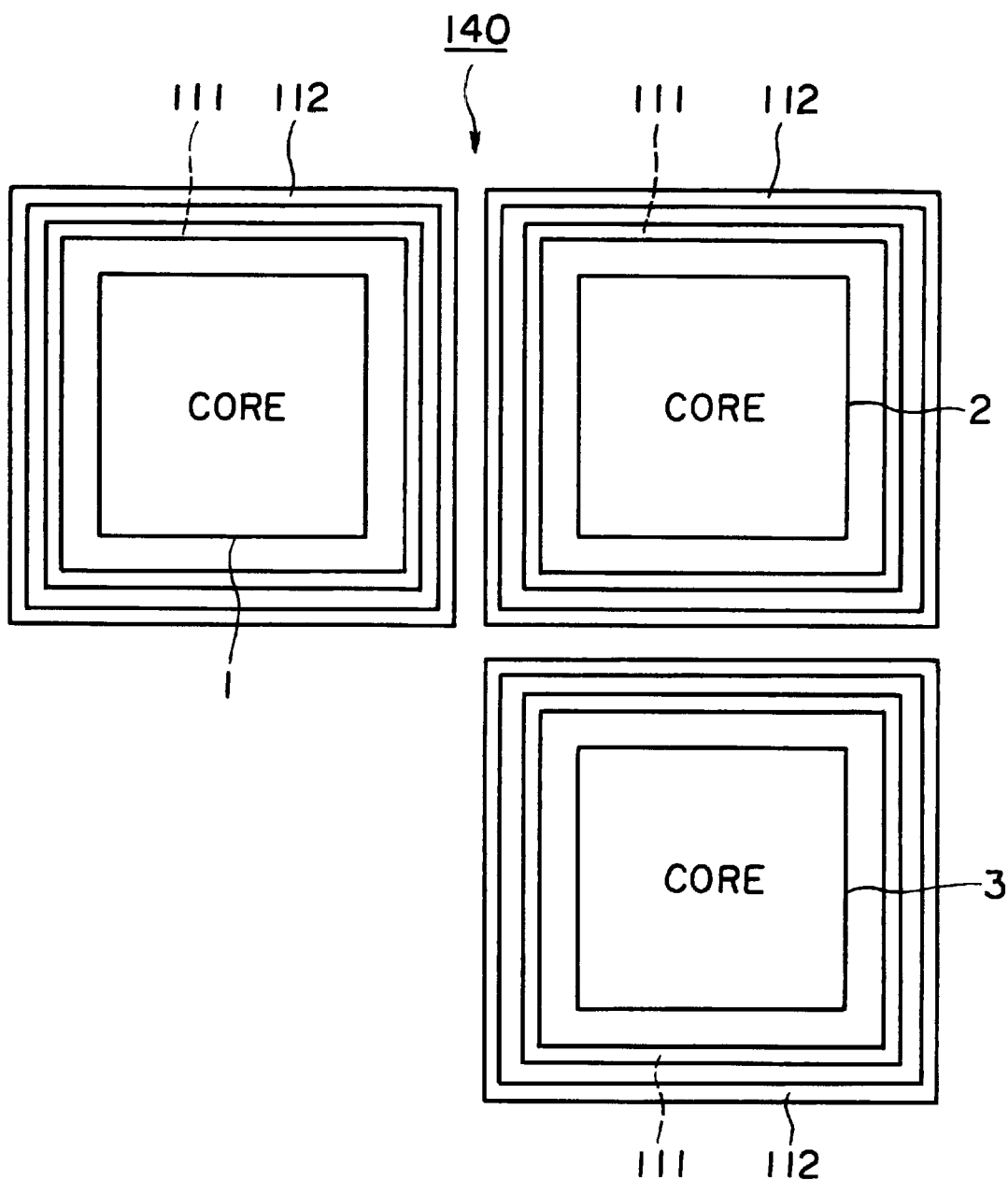
FIG. 4 shows a further example of a semiconductor integrated circuit device having three cores, to which the method shown in FIG. 2 is applied.

Since power lines of core circuits 1 and 2 are thus connected through the common side lines 14z and 15z, as will be understood in the comparison with the semiconductor device shown in FIG. 3, the interconnection area between two core circuits 1 and 2 is remarkably decreased and then the integration of the semiconductor device can be increased with high flexibility in design.

Figure 11:
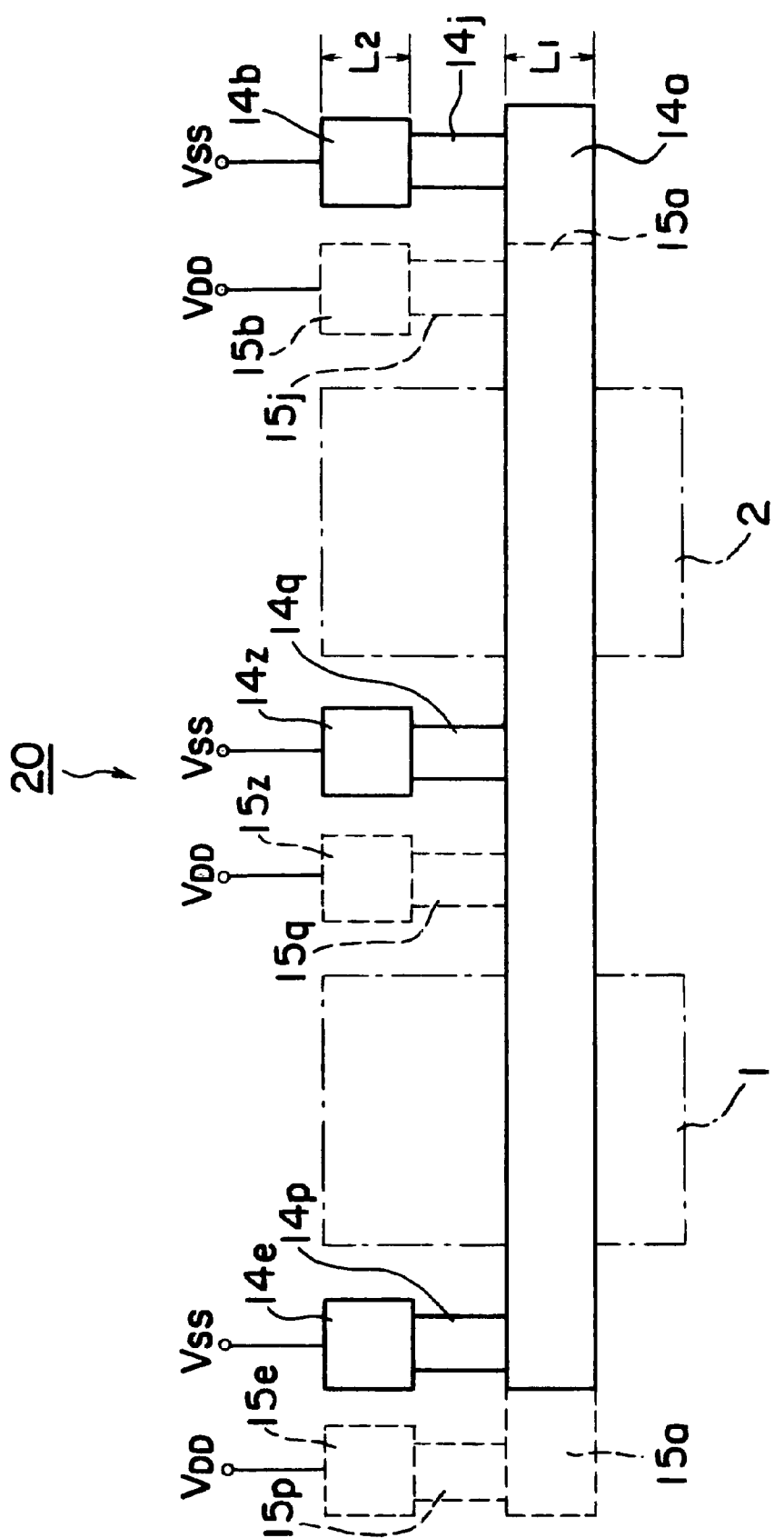
FIG. 11 is a sectional view showing the semiconductor integrated circuit shown in FIG. 10.

FIG. 11 is a sectional view showing the semiconductor integrated circuit shown in FIG. 10 along B—B line. In FIG.

11, as is the case with FIG. 6, the region enveloped by solid line shows the shape of line 14, the region enveloped by dotted line shows the shape of line 15 and the region in dashed line shows the cores 1 and 2.

As shown in FIG. 11, at front side of the core circuits 1 and 2, a side line 14a is formed in the layer L1 of the semiconductor substrate. Sections of the side lines 14b, 14e are shown in the interconnection layer L2 above the ends of the side line 14a and are formed to extend to the direction backward and perpendicular of the paper. At the ends of the side line 14a interlayer interconnections 14j and 14p are formed to be connected to the side line 14b and 14e of the layer L2, respectively.

At the left side of the side line 14a, a part of the side line 15a is shown by the dotted line, and by the same manner as for the interconnection 14, at the ends of the side line 15a, interlayer interconnections 15j and 15p are formed to be connected to the side line 15b and 15e of the layer L2, respectively.

Furthermore, FIG. 11 shows that sections of side lines 14z and 15z disposed between the cores 1 and 2, which is the main features of this embodiment. The side lines 14z and 15z are formed between core circuit 1 and 2 in the layer L2 and are respectively connected to interconnections 14a and 15a via the interlayer interconnection 14q and 15q, respectively.

Accordingly, when the interconnection 14 is connected to, for example, the ground terminal, and the interconnection 15 is connected to power terminal, both the core circuits 1 and 2 can be connected to the power terminal at any point of the front side and to the ground terminal at any point of the backside in the layer L1. In the layer L2 both the core circuit 1 and 2 can be connected to the power terminal at any point of the right side and to the ground terminal at any point of the left side.

A variation of the fifth embodiment of a semiconductor integrated circuit according to the invention will be explained referring to a drawing.

Figure 12:
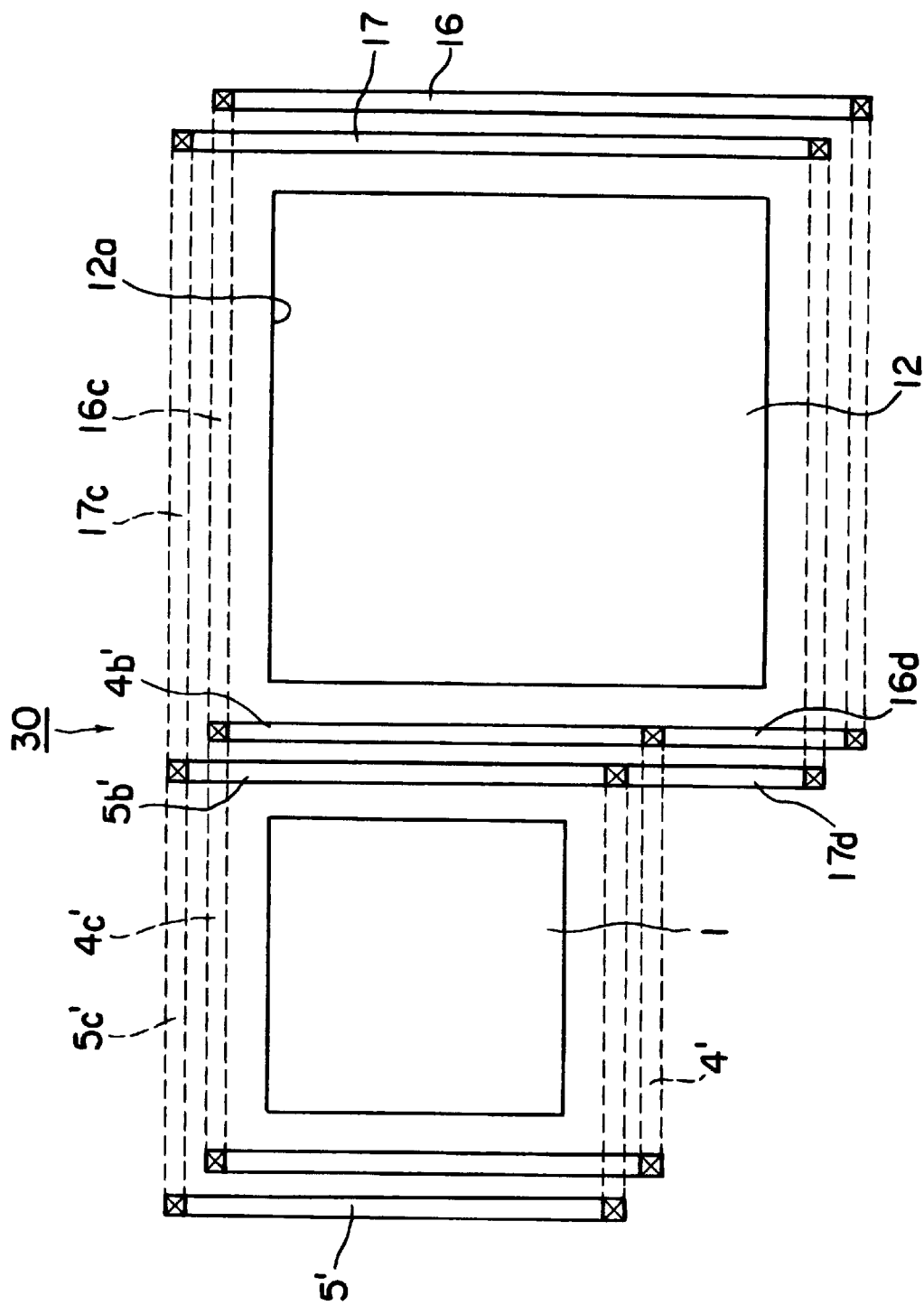
FIG. 12 is a plan view showing a variation of the fifth embodiment of a semiconductor integrated circuit according to the invention.

FIG. 12 is a plan view showing an example having core cells each different in size, for which the fifth embodiment is applied.

The semiconductor integrated circuit device 30 shown in FIG. 12 has two core circuits 1 and 12 which have different sizes. Around the core circuit 1, power lines 4' and 5' are formed in the same shape as lines 4 and 5 of the semiconductor integrated circuit device shown in FIG. 5, while lines 16 and 17 similar to the lines 4' and 5' are formed around the core circuit 12.

The core circuit 1 and 12 has similar shapes in plan view to each other. Therefore, by arranging two cores 1 and 12 so that the side lines 1a and 12a are on a same line, the side line formed in the area between core circuits 1 and 12 can be shared.

In this example, cores 1 and 12 are arranged so that the side line 1a (upside on the paper) of the core circuit 1 and the side line 12a (upside on the paper)of the core circuit 12 are on the same line, therefore the side lines 4'c and 5'c of the power line 4' and 5' around the core circuit 1 can be respectively connected with the side lines 16c and 17c around the core circuit 12. In addition, the side lines 4b' and 5b' can be respectively shared as part of the side lines 16d and 17d of the power lines 16 and 17.

Two power lines can thus be formed only in the area for two lines for supplying power. Therefore, there is provided a semiconductor integrated circuit device having increased integration with a high flexibility in design.

The sixth embodiment of a semiconductor integrated circuit according to the invention will be then explained referring to a drawing.

Figure 13:
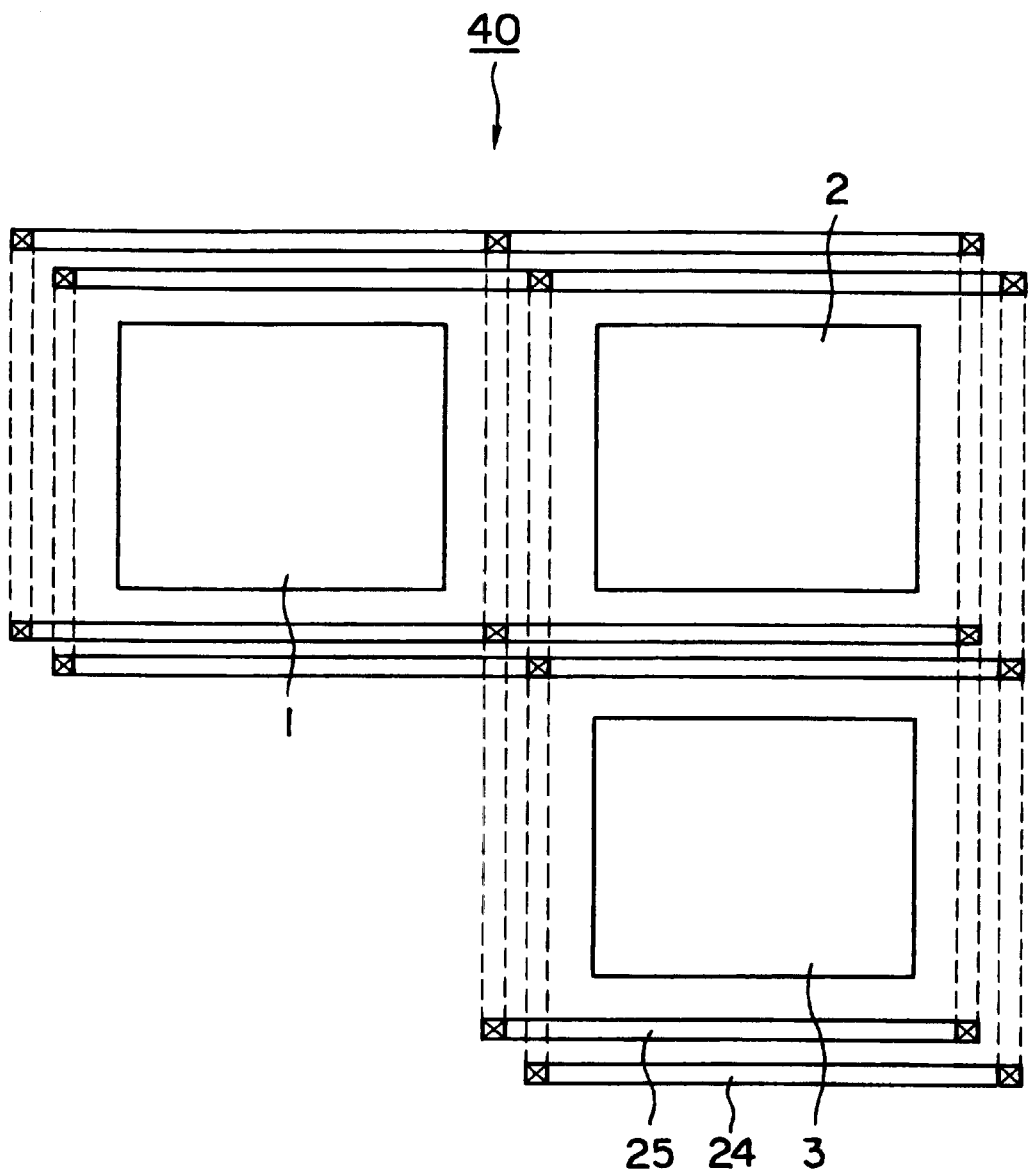
FIG. 13 is a plan view showing a main part of the sixth embodiment of a semiconductor integrated circuit according to the invention.

FIG. 13 is a plan view showing a main part of the sixth embodiment of a semiconductor integrated circuit device 40 according to the invention. As shown in FIG. 13 the semiconductor integrated circuit device 40 has core circuits 1–3 arranged in matrix manner. The power lines same as that shown FIG. 5 are disposed to surround respective core circuits and connected each other at the corners of the rectangle. A part of these power lines are shared in the interconnection in the area between two cores, and as a result, two lines 24 and 25 are provided in that area.

Though the sectional view of these lines is not attached, these lines are formed through a plurality of layer as is the case of the semiconductor device shown in FIG. 6. For example, side lines in x-direction are formed in the second layer and side lines in y-direction are formed in the first layer. Each core circuit can be thus connected with a power terminal and a ground terminal at any side in respective layer. For example when the line 24 is connected with $V_{DD}$ and the line 25 is connected with $V_{SS}$, core circuits 1–3 are connected with $V_{SS}$, at any position of the front side and with $V_{DD}$ at any position of the backside in the first layer and connected with $V_{DD}$ at any position of the left side and with $V_{SS}$ at any side of the right side.

As the semiconductor integrated circuit device 40 has two power lines formed through a plurality of layers and the core circuit can be connected with a power terminal and a ground terminal at opposing sides of four sides of the core circuit respectively, the flexibility in design is enhanced. Furthermore, common use of the side line in the area between cores enables to increase the integration as a whole. Thus there is provided a semiconductor integrated circuit device with high flexibility in design and the degree of integration.

The seventh embodiment of a semiconductor integrated circuit according to the invention will be explained hereafter with reference to a drawing.

Figure 14:
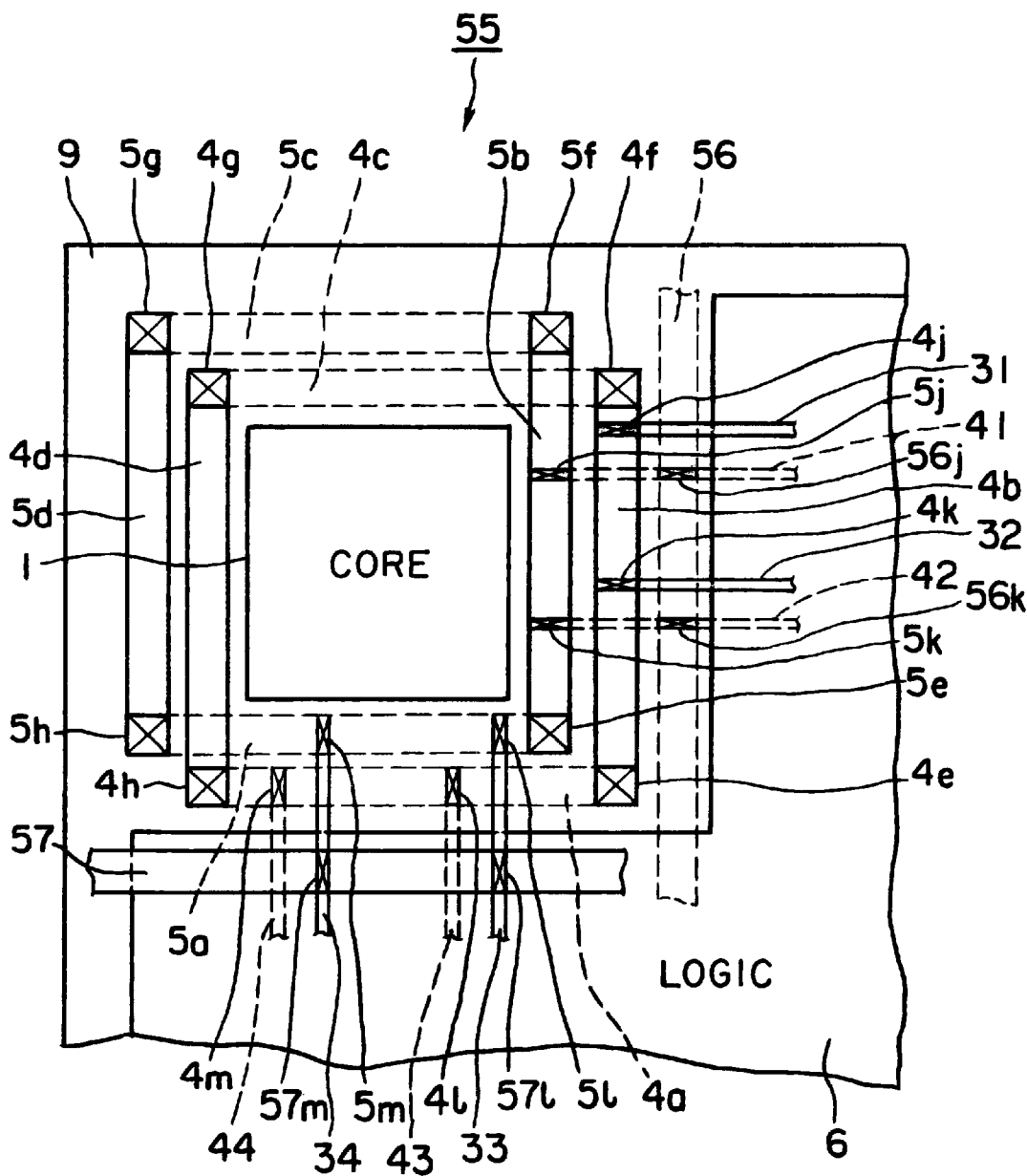
FIG. 14 is a plan view showing a main part of the seventh embodiment of a semiconductor integrated circuit according to the invention.

FIG. 14 is a plan view showing a main part of the embodiment 55. As for the semiconductor device 55 shown in FIG. 14, the core circuit 1 and the power lines 4 and 5 are arranged in the corner of the area for elements and logic circuit 6 including gate arrays and so on is formed adjacent thereto.

This embodiment is featured that the power lines 4 and 5 connected to $V_{DD}$ and $V_{SS}$, respectively, are connected to not only the core circuit 1 but also to a logic circuit 6 via reinforcing lines 31–34 and 41–44 to supply the power thereto. By employing such arrangement, the core circuit 1 and the logic circuit 6 are respectively connected via the common lines 4a, 4b, 5a and 5b to $V_{DD}$ and $V_{SS}$. Therefore the interconnection area between the core circuit 1 and the logic circuit 6 is decreased and then the arrangement exalts the integration of semiconductor device as a whole while maintaining high flexibility in design. Besides, in this embodiment, in order to improve the integration at the corners of the element area, the width of the lines 4 and 5 are made corresponded to that of side lines 4c, 4d, 5c, 5d where current flow is low due to lack of connection with the reinforcing interconnection. Therefore to avoid the problems of voltage drop or EM and so forth taking place at the common line 4a, 4b and 5a, 5b where large current might flow, the third line 56 and the fourth line 57 are comprised parallel to the common line 4c, 4d, 5c, 5d in addition thereto and are interconnected to the common line 5b, 5a via contact pads 56j, 56k and 57l, 57m to reinforce the connection with $V_{DD}$ and $V_{SS}$.

The eighth embodiment of a semiconductor integrated circuit according to the invention will be explained hereafter with reference to a drawing.

Figure 15:
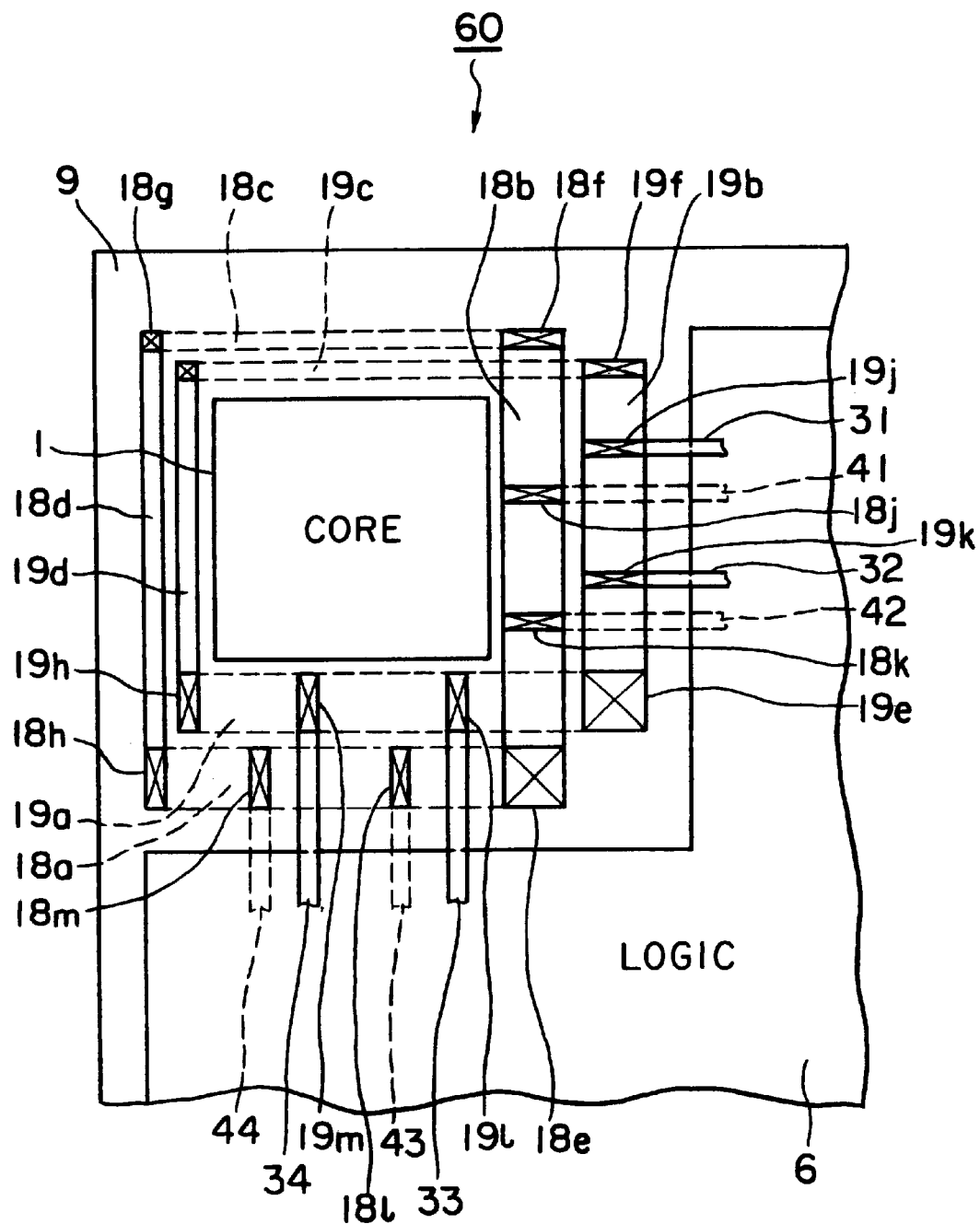
FIG. 15 is a plan view showing a main part of the eighth embodiment of a semiconductor integrated circuit according to the invention.

FIG. 15 is a plan view showing a main part of a semiconductor integrated circuit 60 of the eighth embodiment. This embodiment is featured that widths of power lines are different from those in the first to seventh embodiments described above.

More specifically, of all portions of power lines 18 and 19 connecting the core circuit 1 and the logic circuit 6 to $V_{DD}$ and $V_{SS}$, common lines 18a, 18b, 19a and 19b which supply the power for both the core circuit 1 and the logic circuit 6 are made wider than the side lines 18c, 18d, 19c and 19d which supply the power only for the core circuit 1.

Thus, by making the common lines for the core circuit 1 and the logic circuit 6 and for flowing large current thicker than other lines for flowing relatively small current, problems of voltage drop and EM will be eliminated. Therefore, it is not necessary to provide the third line 56 or the fourth line 57 shown in FIG. 14. Power lines can thus be formed in dimension equal or less than lines having unified width, which have similar function of the reinforcing lines such as lines 31–34 or 41–44. Consequently, there is provided a semiconductor integrated circuit device having improved flexibility in design and a higher integration. It should be noted that in this embodiment, the semiconductor integrated circuit device 60 shown in FIG. 15 is configured by using the circuit arrangement shown in FIG. 7 as a fundamental configuration.

In the embodiment, it is described that the common side lines 18a, 18b, 19a and 19b are formed in the same width and side lines 18c, 18d, 19a and 19b supplying power only to the core circuit 1 are also formed in the same width, however, the width of power lines are not limited to such embodiment and may be selected in various way according to required specification, for example, to have different width one another.

Preferred embodiments of the invention have been explained, however, the invention is not restricted by the embodiments and may be applied in various modes without departing from the scope of the invention. For example, in the above mentioned fifth to seventh embodiments, the circuit arrangement shown in FIG. 5 is used but it should not be restricted by this arrangement. Similar effect may be obtained by using the circuit arrangement of the second, third or fourth embodiment. As for the eighth embodiment, the circuit arrangement of the first, third or fourth embodiment may also be used.

What is claimed is:

1. A semiconductor integrated circuit device comprising:
a core circuit having a plan rectangular shape,
a first interconnection disposed around the core circuit and adapted to connect the core circuit to a first external terminal, and
a second interconnection disposed around said first interconnection and adapted to connect the core circuit to a second external terminal,
wherein:
said first interconnection and said second interconnection have overlapping parts formed through different layers,
said first interconnection has a plurality of layers for interconnection, and
said second interconnection has a plurality of layers.

2. A semiconductor integrated circuit device comprising:
a core circuit having a plan rectangular shape,
a first interconnection disposed around the core circuit and adapted to connect the core circuit to a first external terminal, and
a second interconnection disposed around said first interconnection and adapted to connect the core circuit to a second external terminal,
wherein:
said first interconnection and said second interconnection have overlapping parts formed through different layers,
x-direction portions of the first and the second interconnections are formed in a first layer for interconnection, and
y-direction portions of the first and the second interconnections are formed in a second layer for interconnection, both interconnections being in different levels.

3. The semiconductor integrated circuit device according to claim 2, wherein each end of the x-direction portion of the first and the second interconnections is connected to the corresponding end of the y-direction portion thereof by means of interlayer interconnections.

4. A semiconductor integrated circuit device comprising:
a core circuit having a plan rectangular shape,
a first interconnection disposed around the core circuit and adapted to connect the core circuit to a first external terminal, and
a second interconnection disposed around said first interconnection and adapted to connected the core circuit to a second external terminal,
wherein:
said first interconnection and said second interconnection have overlapping parts formed through different layers,
the length of said first interconnection is approximately equal to that of said second interconnection, and
said second interconnection is formed in an area shifted from said first interconnection along a diagonal line which passes opposing corners of the rectangular shape of the core circuit in a plan view.

5. A semiconductor integrated circuit device comprising:
a core circuit having a plan rectangular shape,
a first interconnection disposed around the core circuit and adapted to connect the core circuit to a first external terminal, and
a second interconnection disposed around said first interconnection and adapted to connect the core circuit to a second external terminal,
wherein:
said first interconnection and said second interconnection have overlapping parts formed through different layers,
said first interconnection and said second interconnection have oblong shapes in plan view which are arranged so that long sides thereof are orthogonal to each other,
the first interconnection is formed so that long sides thereof are disposed between short sides of the second interconnection and the core circuit,
one of short sides thereof is located between the long side of the second line facing the one side, and
the other short side of thereof is located outward the long side of the second line facing the other short side.

6. A semiconductor integrated circuit device comprising:
a plurality of core circuits each having a plan rectangular shape,
a first interconnection disposed around the core circuits and adapted to connect the core circuits to a first external terminal, and a second interconnection disposed around said first interconnection and adapted to connect the core circuits to a second external terminal, wherein said first interconnection and said second interconnection have overlapping parts formed through different layers, and wherein said first interconnection and said second interconnection use at least one side line between two adjacent core circuits commonly.

7. The semiconductor integrated circuit device according to claim 6, wherein:

the core circuits have similar dimensions and are formed so that the corresponding sides of the rectangular shapes are on the same line, and the first interconnections and the second interconnections use side lines between the core circuits commonly.

8. The semiconductor integrated circuit device according to claim 6, wherein:

said core circuits have different dimensions and are arranged so that the corresponding sides of the rectangular shape thereof are on the same line, the first interconnection commonly uses part of the side lines between adjacent core circuits, and the second interconnection commonly uses part of the side lines between adjacent core circuits.

9. A semiconductor integrated circuit device comprising:

a core circuit having a plan rectangular shape, a first interconnection disposed around the core circuit and adapted to connect the core circuit to a first external terminal, a second interconnection disposed around said first interconnection and adapted to connect the core circuit to a second external terminal, and a logic circuit adjacent said core circuit, wherein said first interconnection and said second interconnection have overlapping parts formed through different layers, and wherein parts of these interconnections located between the core circuit and the logic circuit are commonly used by the logic circuit and the core circuit.

10. The semiconductor integrated circuit device according to claim 9, wherein the side lines of the first interconnection and the second interconnection have different width.

11. The semiconductor integrated circuit device according to claim 9, wherein the side lines of the first interconnection and the second interconnection commonly used by the logic circuit and the core circuit are wider than the other side lines.

* * * * *